United States Patent
Slik et al.

(10) Patent No.: US 10,514,984 B2
(45) Date of Patent: Dec. 24, 2019

(54) RISK BASED REBUILD OF DATA OBJECTS IN AN ERASURE CODED STORAGE SYSTEM

(71) Applicant: NetApp, Inc., Sunnyvale, CA (US)

(72) Inventors: David Anthony Slik, Northridge, CA (US); Shehbaz Jaffer, Pune (IN); Sethuraman Subbiah, San Jose, CA (US); Keith Arnold Smith, Cambridge, MA (US); Giridhar Appaji Nag Yasa, Bangalore (IN); Atish Kathpal, New Delhi (IN)

(73) Assignee: NetApp, Inc., Sunnyvale, CA (US)

( * ) Notice: Subject to any disclaimer, the term of this patent is extended or adjusted under 35 U.S.C. 154(b) by 119 days.

(21) Appl. No.: 15/055,484

(22) Filed: Feb. 26, 2016

(65) Prior Publication Data

US 2017/0249213 A1    Aug. 31, 2017

(51) Int. Cl.
  G06F 11/00 (2006.01)
  G06F 11/10 (2006.01)
  (Continued)

(52) U.S. Cl.
  CPC .......... *G06F 11/1092* (2013.01); *G06F 3/064* (2013.01); *G06F 3/067* (2013.01);
  (Continued)

(58) Field of Classification Search
  CPC .... G06F 11/1092; G06F 3/0683; G06F 3/064; G06F 3/0619; H03M 13/154
  (Continued)

(56) References Cited

U.S. PATENT DOCUMENTS 4,543,654 A    9/1985  Jones
5,271,012 A *  12/1993 Blaum ................ G06F 11/1092
                                                    714/6.24
(Continued)

FOREIGN PATENT DOCUMENTS

NO    2013152811 A1    10/2013

OTHER PUBLICATIONS

International Search Report and Written Opinion for Application No. PCT/US2015/048177 dated Dec. 10, 2015, 8 pages.
(Continued)

*Primary Examiner* — Yair Leibovich
(74) *Attorney, Agent, or Firm* — Cesari and McKenna, LLP

(57) ABSTRACT

A rebuild node of a storage system can assess risk of the storage system not being able to provide a data object. The rebuild node(s) uses information about data object fragments to determine health of a data object, which relates to the risk assessment. The rebuild node obtains object fragment information from nodes throughout the storage system. With the object fragment information, the rebuild node(s) can assess object risk based, at least in part, on the object fragments indicated as existing by the nodes. To assess object risk, the rebuild node(s) treats absent object fragments (i.e., those for which an indication was not received) as lost. When too many object fragments are lost, an object cannot be rebuilt. The erasure coding technique dictates the threshold number of fragments for rebuilding an object. The risk assessment per object influences rebuild of the objects.

20 Claims, 7 Drawing Sheets

(51) Int. Cl.
  *H03M 13/15* (2006.01)
  *G06F 3/06* (2006.01)
  *H03M 13/13* (2006.01)
  *H03M 13/37* (2006.01)

(52) U.S. Cl.
  CPC .......... *G06F 3/0619* (2013.01); *H03M 13/13* (2013.01); *H03M 13/154* (2013.01); *H03M 13/373* (2013.01)

(58) Field of Classification Search
  USPC ....................................................... 714/6.24
  See application file for complete search history.

(56) References Cited

U.S. PATENT DOCUMENTS

| | | | |
|---|---|---|---|
| 5,687,365 | A | 11/1997 | Velissaropoulos et al. |
| 6,115,200 | A | 9/2000 | Allen et al. |
| 6,505,216 | B1 | 1/2003 | Schutzman et al. |
| 6,714,371 | B1 | 3/2004 | Codilian |
| 6,735,033 | B1 | 5/2004 | Codilian et al. |
| 7,177,248 | B2 | 2/2007 | Kim et al. |
| 7,333,282 | B2 | 2/2008 | Iseri et al. |
| 7,408,732 | B2 | 8/2008 | Kisaka et al. |
| 8,099,605 | B1 | 1/2012 | Billsroem et al. |
| 8,239,621 | B2 | 8/2012 | Yamato |
| 8,375,012 | B1 | 2/2013 | Graefe et al. |
| 8,566,520 | B1 | 10/2013 | Bitner et al. |
| 8,625,636 | B2 | 1/2014 | Baptist et al. |
| 8,650,159 | B1 | 2/2014 | Zhang et al. |
| 8,768,983 | B2 | 7/2014 | Kohlscheen et al. |
| 8,819,259 | B2 | 8/2014 | Zuckerman et al. |
| 8,838,911 | B1 | 9/2014 | Hubin et al. |
| 8,949,449 | B2 | 2/2015 | Zuckerman et al. |
| 8,959,281 | B1 | 2/2015 | Malina et al. |
| 8,959,305 | B1 | 2/2015 | Lecrone et al. |
| 8,990,162 | B1 | 3/2015 | Kushwah et al. |
| 9,269,376 | B1 | 2/2016 | Hess et al. |
| 9,329,991 | B2 | 5/2016 | Cohen et al. |
| 9,361,301 | B1 | 6/2016 | Bushman |
| 9,471,366 | B2 | 10/2016 | Bolte et al. |
| 10,009,575 | B1* | 6/2018 | Liu .......................... H04N 5/94 |
| 2002/0095546 | A1 | 7/2002 | Dimitri et al. |
| 2003/0105852 | A1 | 6/2003 | Das et al. |
| 2004/0153479 | A1 | 8/2004 | Mikesell et al. |
| 2004/0162940 | A1 | 8/2004 | Yagisawa et al. |
| 2004/0213149 | A1 | 10/2004 | Mascolo |
| 2005/0192932 | A1 | 9/2005 | Kazar et al. |
| 2006/0253651 | A1 | 11/2006 | Inoue et al. |
| 2006/0271339 | A1 | 11/2006 | Fukada |
| 2007/0104049 | A1 | 5/2007 | Kim et al. |
| 2007/0113004 | A1 | 5/2007 | Sugimoto et al. |
| 2007/0156405 | A1 | 7/2007 | Schulz et al. |
| 2007/0177739 | A1 | 8/2007 | Ganguly et al. |
| 2007/0203927 | A1 | 8/2007 | Cave et al. |
| 2008/0126357 | A1 | 5/2008 | Casanova et al. |
| 2008/0151724 | A1* | 6/2008 | Anderson .......... G06F 11/1471 369/53.42 |
| 2008/0201336 | A1 | 8/2008 | Yamato |
| 2008/0201401 | A1 | 8/2008 | Pugh et al. |
| 2008/0313398 | A1 | 12/2008 | Koseki |
| 2009/0100055 | A1 | 4/2009 | Wang |
| 2009/0154559 | A1 | 6/2009 | Gardner |
| 2009/0327840 | A1 | 12/2009 | Moshayedi |
| 2010/0030960 | A1 | 2/2010 | Kamalavannan et al. |
| 2010/0064166 | A1 | 3/2010 | Dubnicki et al. |
| 2010/0094921 | A1 | 4/2010 | Roy et al. |
| 2010/0094957 | A1 | 4/2010 | Zuckerman et al. |
| 2010/0095012 | A1* | 4/2010 | Zuckerman ......... H04L 67/1097 709/231 |
| 2010/0095060 | A1 | 4/2010 | Strange et al. |
| 2010/0162031 | A1 | 6/2010 | Dodgson et al. |
| 2010/0174968 | A1* | 7/2010 | Charles ............... H03M 13/373 714/781 |
| 2010/0185690 | A1 | 7/2010 | Evans et al. |
| 2010/0293354 | A1 | 11/2010 | Perez et al. |
| 2010/0306174 | A1 | 12/2010 | Otani |
| 2010/0325345 | A1 | 12/2010 | Ohno et al. |
| 2011/0191629 | A1 | 8/2011 | Daikokuya et al. |
| 2011/0296104 | A1 | 12/2011 | Noda et al. |
| 2012/0060072 | A1 | 3/2012 | Simitci et al. |
| 2012/0072689 | A1* | 3/2012 | Kempen ........... G06F 17/30215 711/162 |
| 2012/0226886 | A1 | 9/2012 | Hatfield et al. |
| 2013/0054889 | A1 | 2/2013 | Vaghani et al. |
| 2013/0086340 | A1 | 4/2013 | Fleming et al. |
| 2013/0238235 | A1 | 9/2013 | Kitchel et al. |
| 2013/0297905 | A1 | 11/2013 | Yang et al. |
| 2013/0346794 | A1 | 12/2013 | Bartlett et al. |
| 2014/0013046 | A1 | 1/2014 | Corbett et al. |
| 2014/0108707 | A1 | 4/2014 | Nowoczynski et al. |
| 2014/0207899 | A1 | 7/2014 | Mark et al. |
| 2014/0237024 | A1 | 8/2014 | Chen et al. |
| 2014/0297680 | A1 | 10/2014 | Triou, Jr. et al. |
| 2014/0331085 | A1 | 11/2014 | Dhuse et al. |
| 2014/0344532 | A1 | 11/2014 | Lazier |
| 2015/0067245 | A1 | 3/2015 | Kruger |
| 2015/0161163 | A1 | 6/2015 | Cypher et al. |
| 2015/0254008 | A1 | 9/2015 | Tal, II et al. |
| 2015/0256577 | A1 | 9/2015 | Gutiérrez et al. |
| 2015/0269964 | A1 | 9/2015 | Fallone et al. |
| 2015/0363126 | A1 | 12/2015 | Frick |
| 2015/0378825 | A1 | 12/2015 | Resch |
| 2016/0070617 | A1 | 3/2016 | Algie et al. |
| 2016/0179621 | A1 | 6/2016 | Schirripa et al. |
| 2016/0232168 | A1 | 8/2016 | Lemoal |
| 2016/0314043 | A1 | 10/2016 | Slik |
| 2017/0031752 | A1 | 2/2017 | Cilfone et al. |
| 2017/0060481 | A1 | 3/2017 | Leggette et al. |
| 2017/0109247 | A1 | 4/2017 | Nakajima |

OTHER PUBLICATIONS

Amer, et al., "Data Management and Layout for Shingled Magnetic Recording", IEEE Transactions on Magnetics, Oct. 2011, vol. 47, No. 10., pp. 3691-3697, retrieved on Oct. 15, 2015 from http://www.ssrc.ucsc.edu/Papers/amer-eeetm11.pdf.

Amer, et al., "Design Issue for a Shingled Write Disk System", 26th IEEE Symposium on Massive Storage Systems and Technologies (MSST 2010), May 2010, 12 pages, retrieved on Oct. 20, 2015 from http://storageconference.us/2010/Papers/MSST/Amer.pdf.

Dunn, et al., "Shingled Magnetic Recording Models, Standardization, and Applications", SNIA Education, Storage Networking Industry Association, Sep. 16, 2014, 44 pages, retrieved on Oct. 21, 2015 from http://www.snia.org/sites/default/files/Dunn-Feldman_SNIA_Tutorial_Shingled_Magnetic_Recording-r7_Final.pdf.

Feldman, et al., "Shingled Magnetic Recording Areal Density Increase Requires New Data Management", USENIX, The Advanced Computing Systems Association, Jun. 2013 vol. 38 No. 3, pp. 22-30, retrieved on Oct. 21, 2015 from https://www.cs.cmu.edu/~garth/papers/05_feldman_022-030_final.pdf.

Gibson, et al., "Direction for Shingled-Write and Two-Dimensional Magnetic Recording System Architectures: Synergies with Solid-State Disks", Carnegie Mellon University Parallel Data Lab Technical Report CMU-PDL-09-104, May 2009, 2 pages, retrieved on Oct. 20, 2015 from http://www.pdl.cmu.edu/PDL-FTP/PDSI/CMU-PDL-09-104.pdf.

Gibson, et al., "Principles of Operation for Shingled Disk Devices", Carnegie Mellon University Parallel Data Laboratory CMU-PDL-11-107, Apr. 2011, 9 pages, retrieved on Oct. 20, 2015 from http://www.pdl.cmu.edu/PDL-FTP/Storage/CMU-PDL-11-107.pdf.

Luo, "Implement Object Storage with SMR based Key-Value Store", 2015 Storage Developer Conference, Huawei Technologies Co., Sep. 2015, 29 pages, retrieved on Oct. 20, 2015 from http://www.snia.org/sites/defaultifiles/SDC15_presentations/smr/QingchaoLuo_Implement_Object_Storage_SMR_Key-Value_Store.pdf.

Megans, "Spectra Logic Announces Breakthrough in Nearline Disk, ArcticBlue", SPECTA Logic, Boulder, CO, Oct. 15, 2015, 5 pages, retrieved on Oct. 20, 2015 from https://www.spectralogic.com/2015/10/15/spectra-logic-announces-breakthrough-in-nearline-disk-arcticblue/.

(56) References Cited

OTHER PUBLICATIONS

O'Reily, J., "RAID Vs. Erasure Coding", Network Computing, Jul. 14, 2014, 2 pages, retrieved on Apr. 1, 2016 from http://www.networkcomputing.com/storage/raid-vs-erasure-coding/1792588127.
SMR Layout Optimisation for XFS, Mar. 2015, v0.2, 7 pages, retrieved on Apr. 29, 2016 from http://xfs.org/images/f/f6/Xfs-smr-structure-01.pdf.
Suresh, et al., "Shingled Magnetic Recording for Big Data Applications", Parallel Data Laboratory, Carnegie Mellon University, Pittsburg, PA CMU-PDL-12-105, May 2012, 29 pages, retrieved on Oct. 20, 2015 from http://www.pdl.cmu.edu/PDL-FTP/FS/CMU-PDL-12-105.pdf.
Rabin "Efficient Dispersal of Information for Security, Load Balancing, and Fault Tolerance," Journal of the Association for Computing Machinery, vol. 36, No. 2, Apr. 1989, pp. 335-348.
Li; X., "Reliability Analysis of Deduplicated and Erasure-Coded Storage", ACM Sigmetrics Performance Evaluation Review, Jan. 3, 2011, pp. 4-9, vol. 38 Issue 3, ACM, New York, NY.
Renzoni; R., "Wide Area Storage From Quantum", CIO Summit, 2013, 24 pages. Obtained from http://www.ciosummits.com/media/presentations/cio_spring_2013/Certainty_in_a_Virtual_World.pdf on Feb. 25, 2016.
Seshadri; S., "High Availability and Data Protection with EMC Isilon Scale-Out NAS," EMC Corporation, White Paper, Jun. 2015, 37 pages. https://www.emc.com/collateral/hardware/white-papers/h10588-isilon-data-availability-protection-wp.pdf as visited Oct. 5, 2015.
Speciale; P., "Scality RING: Scale Out File System & Hadoop over CDMI," Scality, Storage Developer Conference, Sep. 19-Sep. 22, 2014, 26 pages. http://www.snia.org/sites/default/files/PaulSpeciale_Hadoop_Ring.pdf as visited Oct. 5, 2015.

\* cited by examiner

RISK BASED REBUILD OF DATA OBJECTS IN AN ERASURE CODED STORAGE SYSTEM

BACKGROUND

The disclosure generally relates to the field of data processing, and more particularly to background rebuild of data objects in an erasure coded storage system.

The amount of data enterprises store has increased at an incredible rate. Research firms present statistics that data is being generated at a rate of multiple petabytes of data per day. For large amounts of inactive data (i.e., data that is rarely accessed), low cost storage solutions are offered. These low cost storage solutions take advantage of the low cost storage devices, which can have corresponding higher failure rates.

BRIEF DESCRIPTION OF THE DRAWINGS

Embodiments of the disclosure may be better understood by referencing the accompanying drawings.

DESCRIPTION

Figure 1:
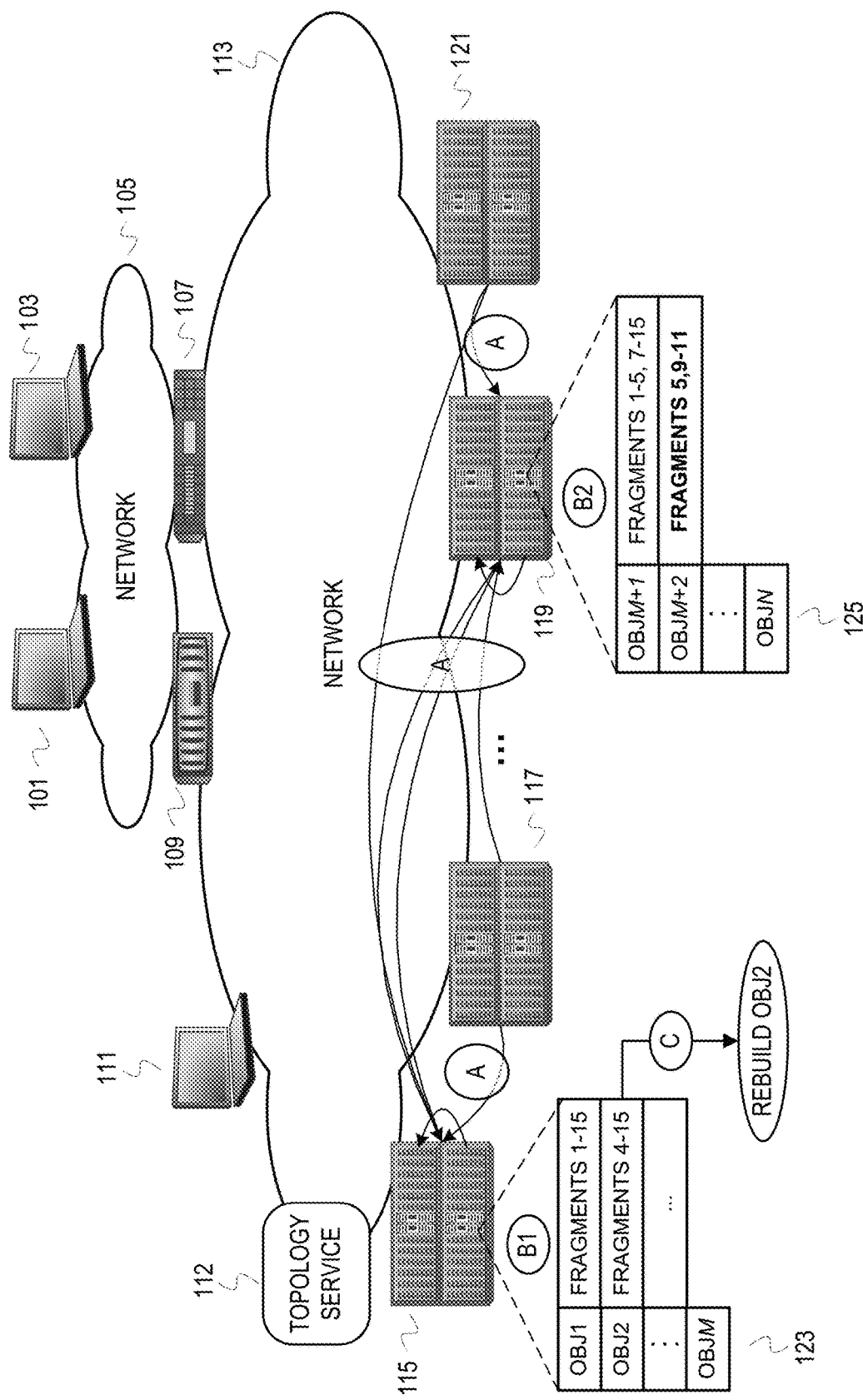
FIG. 1 depicts an example distributed storage system with background rebuild of a data object based on object loss risk assessment.

The description that follows includes example systems, methods, techniques, and program flows that embody embodiments of the disclosure. However, it is understood that this disclosure may be practiced without these specific details. For instance, this disclosure refers to the MapReduce programming model in illustrative examples. But aspects of this disclosure can use other large data set parallel processing programming paradigms. In other instances, well-known instruction instances, protocols, structures and techniques have not been shown in detail in order not to obfuscate the description.

Introduction

Lower reliability is a common, and likely expected, characteristic of low cost storage devices. The lower reliability in combination with the massive scale of data (e.g., petabytes to exabytes of data) impairs and exceeds the protective capability of RAID 5 and RAID 6. Erasure coding techniques with an m greater than 2 (k=number of data fragments, m=additional fragments for protection) can be used to satisfy the demands of greater data on less reliable storage devices. With a protection technique that divides data objects into multiple fragments and a greater number of additional fragments for protection, the amount of data being stored grows further. For instance, a protection technique could use the following hierarchical erasure coding technique: divide an object into 18 fragments and then divide each of those fragments into 18 fragments. For that single data object, a storage system will maintain 324 entries to locate the 324 fragments. Since an enterprise likely maintains a single namespace, at least within departments of an enterprise if not across the enterprise, a database of location indices or a directory for a million objects will have hundreds of millions of entries to locate protected data. Furthermore, an enterprise likely uses distributed storage spanning a number of geographically diverse locations. Thus, the database with hundreds of millions of entries will have synchronization requirements. Such an immense database can impede data protection because maintaining synchronization and accessing the database can be a bottleneck for proactively rebuilding data in a distributed, large scale storage system.

Overview

Proactively rebuilding data objects can be done in a distributed, large scale storage system without a centralized and/or synchronized database or directory for locating the data objects (hereinafter "object location index"). A rebuild node or nodes of the storage system can assess risk of the storage system not being able to provide a data object (i.e., not being able to rebuild the data object). The rebuild node(s) uses information about data object fragments to determine health of a data object (hereinafter "object"), which relates to the risk assessment. The rebuild node(s) obtains object fragment information from nodes throughout the storage system. The nodes can push the object fragment information to the rebuild node(s) or the rebuild node(s) can pull the information from the nodes. With the object fragment information, the rebuild node(s) can assess object risk based, at least in part, on the object fragments indicated as existing by the nodes. To assess object risk, the rebuild node(s) treats absent object fragments (i.e., those for which an indication was not received) as lost. When too many object fragments are lost, an object cannot be rebuilt. The erasure coding technique dictates the threshold number of fragments for rebuilding an object—the closer to the threshold the greater the risk of not being able to rebuild the object. The risk assessment per object influences rebuild of the objects. If additional risk related information is available from the storage controllers, for example information from a Self-Monitoring, Analysis, and Reporting Technology (S.M.A.R.T.) system, the rebuild node(s) can incorporate this information into the risk assessment.

Example Illustrations

FIG. 1 depicts an example distributed storage system with background rebuild of a data object based on object loss risk assessment. The storage system includes racks 115, 117, 119, and 121. Each of the racks houses four storage nodes in FIG. 1, with each storage node managing access to a set of storage devices (e.g., disk drives, flash drives, tape drives, or a combination of different storage media). The racks 115, 117, 119, and 121 may also house network elements to allow for network based communication among the components within the rack. The storage nodes of the racks 115, 117, 119, and 121 communicate with each other over a network 113. The storage devices of the racks 115, 117, 119, 121 host data objects for one or more clients of the storage system. The storage system can be a cloud based storage solution. Data objects stored into the storage system are protected according to an erasure coding technique with the number of additional fragments for protection (m) being greater than 2.

Thus, the storage system fragments a data object into n fragments (n=k+m) and distributes the fragments across the storage nodes.

The storage system also includes intermediary storage nodes 109 and 107. The intermediary storage nodes 107, 109 are client facing nodes that receive requests before being transmitted to the storage nodes within the racks 115, 117, 119, and 121. The intermediary storage nodes 107, 109 can host middleware that accepts application programming interface (API) based calls (e.g., a SWIFT call, S3 call, etc.). These intermediary storage nodes 107, 109 may also perform load balancing, or other devices not depicted can intercept requests and perform load balancing. Client devices 101, 103 submit requests to the intermediary storage nodes 107, 109 via a network 105. FIG. 1 also depicts a device 111 associated with the network 113 to suggest the possibility that the device 111 can interact with the storage nodes of the racks 115, 117, 119, and 121 without an intermediary storage node. For instance, the device 111 may be an administrator device.

FIG. 1 is annotated with a series of letters A-C. These letters represent stages of operations, with each stage representing one or more operations. Although these stages are ordered for this example, the stages illustrate one example to aid in understanding this disclosure and should not be used to limit the claims. Subject matter falling within the scope of the claims can vary with respect to the order and some of the operations.

At stage A, designated storage nodes of the racks 115, 119 receive object fragment information and perform per object risk assessment based on the object fragment information. The designated storage nodes are designated by configuration and/or periodic election before collection of object fragment information. The namespace is divided among these designated storage nodes ("rebuild" nodes) to distribute the work. For reliability, the rebuild nodes may have restrictions, such as satisfying a performance criterion (e.g., minimum amount of low latency memory) and located within mutually exclusive racks. The namespace can be divided by computing hashes of the object identifiers and then a modulo operation to achieve the work division by hashed namespace region. The storage nodes, including the rebuild nodes, may periodically provide ("push") the object fragment information for risk assessment. Instead of a push technique, the rebuild nodes can request ("pull") object fragment information periodically and/or depending on storage system status (e.g., current load on the storage system, or load on the rebuild nodes). In a pull scenario, the rebuild nodes multicast requests for the object fragment information to available storage nodes. In a push scenario, the rebuild nodes multicast notifications of their designations as rebuild nodes. In either case, the rebuild nodes determine available storage nodes throughout the storage system for these multicasts by communicating with a topology service 112. The topology service 112 maintains current topology of the storage system. Topology of the system at least includes identification of storage nodes known as members of the storage system and operating status of those storage nodes. Topology information can include additional information, such as network connectivity (e.g., distance between nodes in terms of latency or links). Stage A is depicted multiple times in FIG. 1 to encompass the transmissions of object fragment information from the storage nodes throughout the storage system. In some cases, a storage node(s) may be unexpectedly unavailable (e.g., failure, network disruption) or expectedly unavailable (e.g., maintenance). Object fragment information collection can account for expected unavailability of storage nodes or storage devices (e.g., scheduling collection for a different time, at least for the affected device(s)).

At stages B1 and B2, the rebuild nodes assess risk of losing objects using the object fragment information. The object fragment information identifies the object fragments currently available in the storage system. The responding storage nodes across the racks 115, 117, 119, 121 maintain local fragment store indices that identify the object fragments stored in the corresponding storage devices. If a storage device becomes unavailable, the corresponding storage node will update the local fragment store index to indicate that all of the object fragments on that storage device are unavailable. The storage node will also update the local fragment store index to indicate an object fragment is unavailable if an attempted retrieval of the object fragment fails. For object fragment information collection, the storage nodes will traverse the local fragment store index and communicate identifiers of the object fragments represented in the local fragment store index. Since the rebuild nodes do not rely on a centralized/synchronized object location index, the rebuild nodes use the communicated object identifiers from the storage nodes throughout the storage system to determine which object fragments are available for object rebuilds. The rebuild node operates under the assumption that any object fragment for which an identifier is not received is unavailable (e.g., corrupted, erased, etc.). With the object fragment identifiers, the rebuild nodes track available fragments per corresponding object. Effectively, the rebuild nodes take inventory of object fragments for each object by fragment identifiers.

Figure 2:
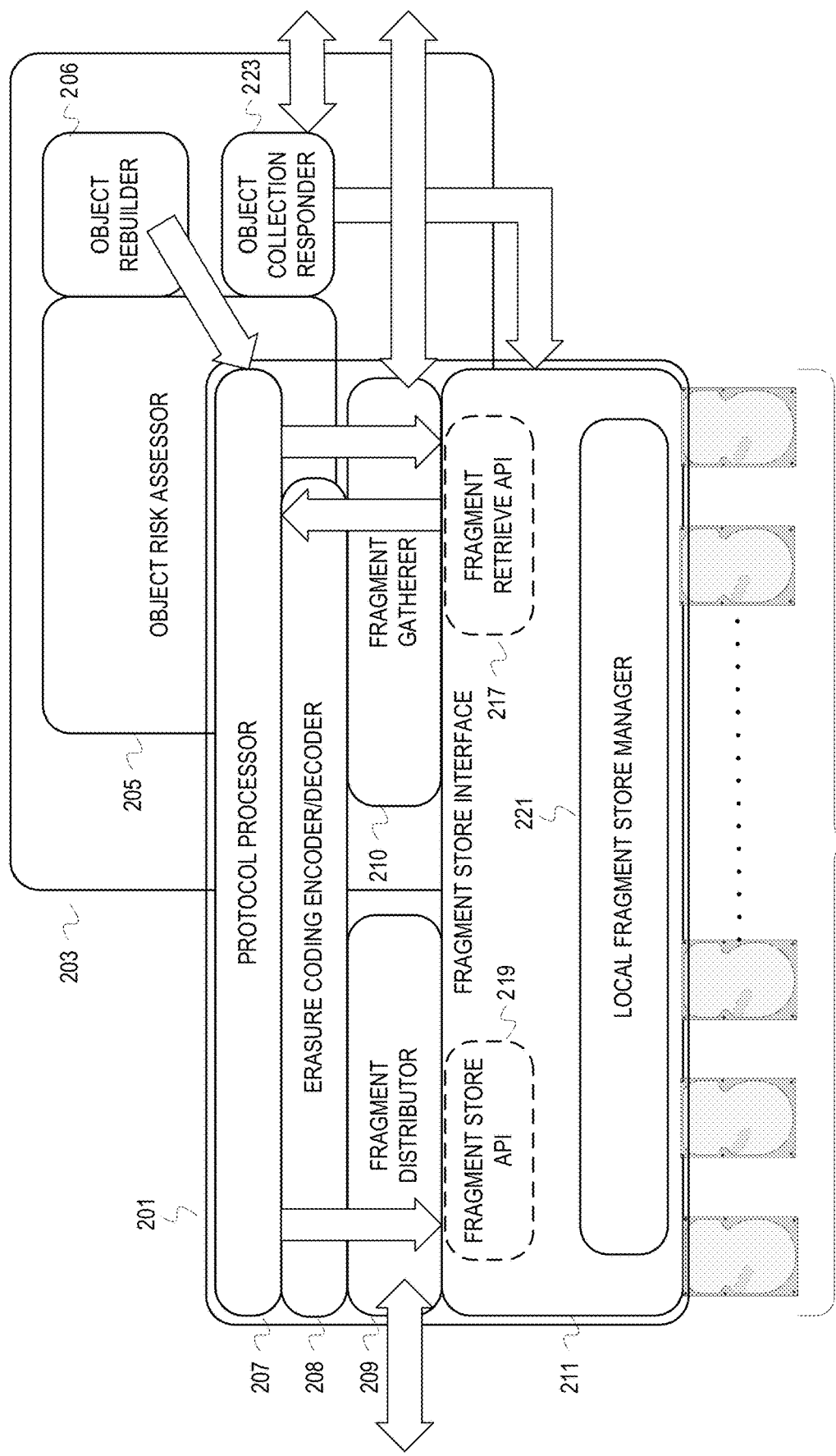
FIG. 2 depicts an example illustration of a storage node architecture.

An example of a rebuild node can aid in understanding the operations of FIG. 1. FIG. 2 depicts an example illustration of a storage node architecture. FIG. 2 depicts architectural components that execute within a foreground execution space 201 and architectural components that execute within a background execution space 203. Any one of the depicted components can be implemented with hardware, such as a field programmable gate array or application specific integrated circuit. Background and foreground execution space are defined by an operating system of the rebuild node. Generally, processes executing in the background will have lower priority for resources than processes in the foreground. This is typically implemented according to a scheduling algorithm. The operating system may distinguish background and foreground execution space with other techniques, such as using process identifiers and allocating distinct memory space for foreground and background processes. The foreground and background distinction can also be expressed as background and foreground tasks instead of processes, with a "task" understood to be a unit of work to be done.

The architectural components that execute within the foreground execution space 201 include a protocol processor 207, an erasure coding encoder/decoder 208, a fragment distributor 209, a fragment gatherer 210, and a fragment store interface 211. The protocol processor 207 processes requests according to one or more protocols used to communicate the requests. The protocol processor 207 decapsulates received protocol data units (e.g., Transmission Control Protocol/Internet Protocol packets). Depending upon the protocol(s), the protocol processor 207 may form a message with decapsulated protocol data units (PDUs) and determine the request (e.g., a hypertext transfer protocol (HTTP) PUT request).

For a store type of request, a store data path traverses the protocol processor 207, the erasure coding encoder/decoder 208, the fragment distributor 209, and possibly the fragment store interface 211. The protocol processor 207 passes a data object to be stored, along with other storage relevant information (e.g., object name), to the erasure coding encoder 208 for fragmenting and encoding. The erasure coding encoder 208 passes the fragments to the fragment distributor 209. The fragment distributor 209 determines target storage nodes for transmitting the fragments. The fragment distributor 209 can access data that indicates target storage nodes available for storing fragments. For example, a listing of open shingled magnetic recording device zones may be communicated among the storage nodes of the storage system. The fragment distributor 209 will pass any fragment(s) to be stored locally to the fragment store interface 211. The fragment store interface 211 will transmit the fragment(s) to be stored locally to one or more of the storage devices 213 managed by the storage node. The fragment store interface 211 includes a local fragment store manager 221. The local fragment store manager 221 maintains a local fragment store index that indicates location (e.g., storage device identifier and zone, sector, block, etc.) of each locally stored fragment. The fragment store interface 211 may also include a fragment store API 219. The fragment distributor 209 would pass data fragments to the fragment store interface 211 according to the fragment store API 219. After the local fragment store manager 221 updates the local fragment store index to reflect a store, the local fragment store manager 221 may then transmit the data fragment according to another API or driver (e.g., small computer system interface (SCSI) driver for writing to the storage devices). When fragments, not objects, are transmitted to a storage node for storing, the transmitting storage node uses the fragment store API 219 of the storage node that will store the fragments.

For a retrieval type of request, a retrieve data path traverses the protocol processor 207, the fragment gatherer 210, the fragment store interface 211, and the erasure coding decoder 208. The protocol processor 207 passes retrieval information (e.g., object name) extracted from a protocol message (e.g., HTTP GET request) to the fragment gatherer 210. The fragment gatherer 210 transmits a request for the object throughout the storage system and passes the request for the object to the fragment store interface 211. The fragment store interface 211 may include a fragment retrieve API 217. In that case, the fragment gatherer 210 passes the object request, or just an object identifier, according to the fragment retrieve API 217. The local fragment store manager 221 will then traverse the local fragment store index to determine whether any fragment of the identified object is stored on the storage devices 213. If the local fragment store index indicates that any fragment of the identified object is stored on the storage device 213, then the local fragment store manager 221 will retrieve the fragment(s) and return it to the fragment gatherer 210. For fragments being retrieved by other storage nodes, the other storage nodes submit the fragment retrieval request via the fragment retrieve API 217 and the fragment store interface 211 returns the retrieved fragments to the requesting storage node, instead of the fragment gatherer 210, according to the fragment retrieve API 217. The fragment gatherer 210 provides the gathered fragments, assuming sufficient fragment have been gathered, to the erasure coding decoder 208 for rebuild/forming of the requested object. If insufficient fragment are returned to the fragment gatherer 210, the fragment gatherer 210 will notify the protocol processor 207 that the object retrieval failed. The fragment gatherer 210 can perform other operations, such as logging when an object retrieval fails. Assuming sufficient fragment are gathered, the erasure coded decoder 208 rebuilds the object with the gathered fragments and provides the object to the protocol processor 207 for returning to the requestor.

For execution in the background execution space 203, the architectural components include an object risk assessor 205, an object collection responder 223, and an object rebuilder 206. The object collection responder 223 interacts with the fragment store interface 211 to identify all available locally stored fragment identifiers. The fragment store interface 211 can have a defined function for collecting all fragment identifiers from the local fragment store index for available fragments. The object collection responder 223 communicates the collected object fragment identifiers to an object risk assessor 205 hosted on a rebuild node.

The object risk assessor 205 assesses risk of data loss per object if the storage node that hosts the object risk assessor 205 is designated as a rebuild node. As previously mentioned, the object risk assessor 205 assesses risk of losing an object (i.e., not being able to rebuild an object) based on fragment inventory and the parameters of the erasure code (any k of n fragments to rebuild). The object risk assessor 205 can be programmed with a function to quantify risk based on the fragment inventory and/or read a policy that defines the function or a threshold(s). As a simple example, degrees of risk can be defined as follows: high risk=0, at risk=1, nominal risk=2, and low risk=3. The object risk assessor 205 can compute the difference between k and the number of gathered fragments (g) and assign that difference as the risk quantification. The object risk assessor 205 can set a ceiling for differences at 3 to conform to the defined degrees of risk. A risk assessment function can be more complex than computing differences between g and k. For example, an object risk assessor 205 can compute risk coefficients based on health information for storage device, storage nodes, cluster health, etc. If hierarchical erasure coding is used to protect data, then risk coefficients can be computed at each level.

The object rebuilder 206 triggers rebuild of objects determined to be at risk by the object risk assessor 205. For an object identified as at risk by the object risk assessor 205, the object rebuilder 206 communicates a retrieve request that indicates the at risk object. The object rebuilder 206 communicates the retrieve request to the protocol processor 207. For example, the object rebuilder 206 communicates a GET request to the protocol processor 207. This will trigger the retrieve data path for the at risk object. When rebuilt for the retrieval, the object rebuilder 206 can then communicate a store request or chain a store request to the retrieve request. For example, the object rebuilder 206 can communicate a compound request to the protocol processor that requests the protocol processor to GET the at risk object and then PUT the retrieved object upon completion of the GET request.

Returning to FIG. 1, the rebuild node at rack 115 has been assigned a namespace region that encompasses objects OBJ1-OBJM. For simplicity of illustration, the namespace for FIG. 1 is divided by integer division of hashed object identifiers instead of a modulo operation. FIG. 1 illustrates a point in time when the rebuild node at rack 115 has determined that all 15 fragments for OBJ1 are available in the storage system. The rebuild node at rack 115 maintains fragment inventory 123 for objects in its assigned namespace region. The rebuild node has determined that fragments 1-3 are not available for OBJ2. Assuming the rebuild node deems an object at risk if only 12 fragments are unavailable (or 3 fragments are not available), the rebuild node will rebuild OBJ2 at stage C. Depending on programming/policy/risk level, rebuild of OBJ2 may be requested immediately or may be scheduled based on degree of risk relative to other objects and/or opportunity (e.g., rebuild for a low risk object may be requested during an idle time). The rebuild node at rack 119 has been assigned a namespace region that encompasses objects OBJM+1 to OBJN. The rebuild node at rack 119 maintains fragment inventory 125 for objects in its assigned namespace region. FIG. 1 illustrates a point in time when the rebuild node at rack 119 has determined that fragment 6 is unavailable for OBJ M+1 the rebuild node is still receiving object fragment information for OBJM+2. The rebuild node at rack 119 determines that OBJ is not at risk so no rebuild is requested.

Figure 3:
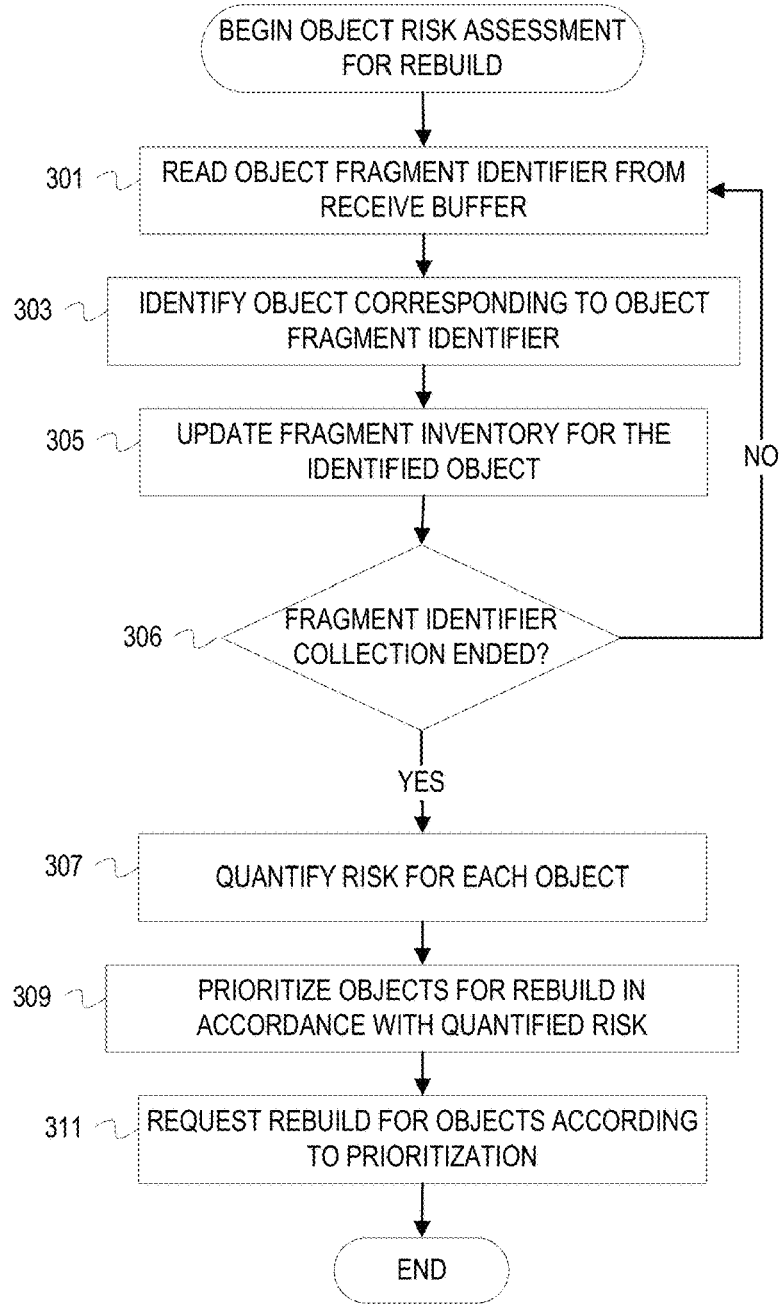
FIG. 3 is a flowchart of example operations for background risk assessment for object rebuild after fragment inventory.
Figure 4:
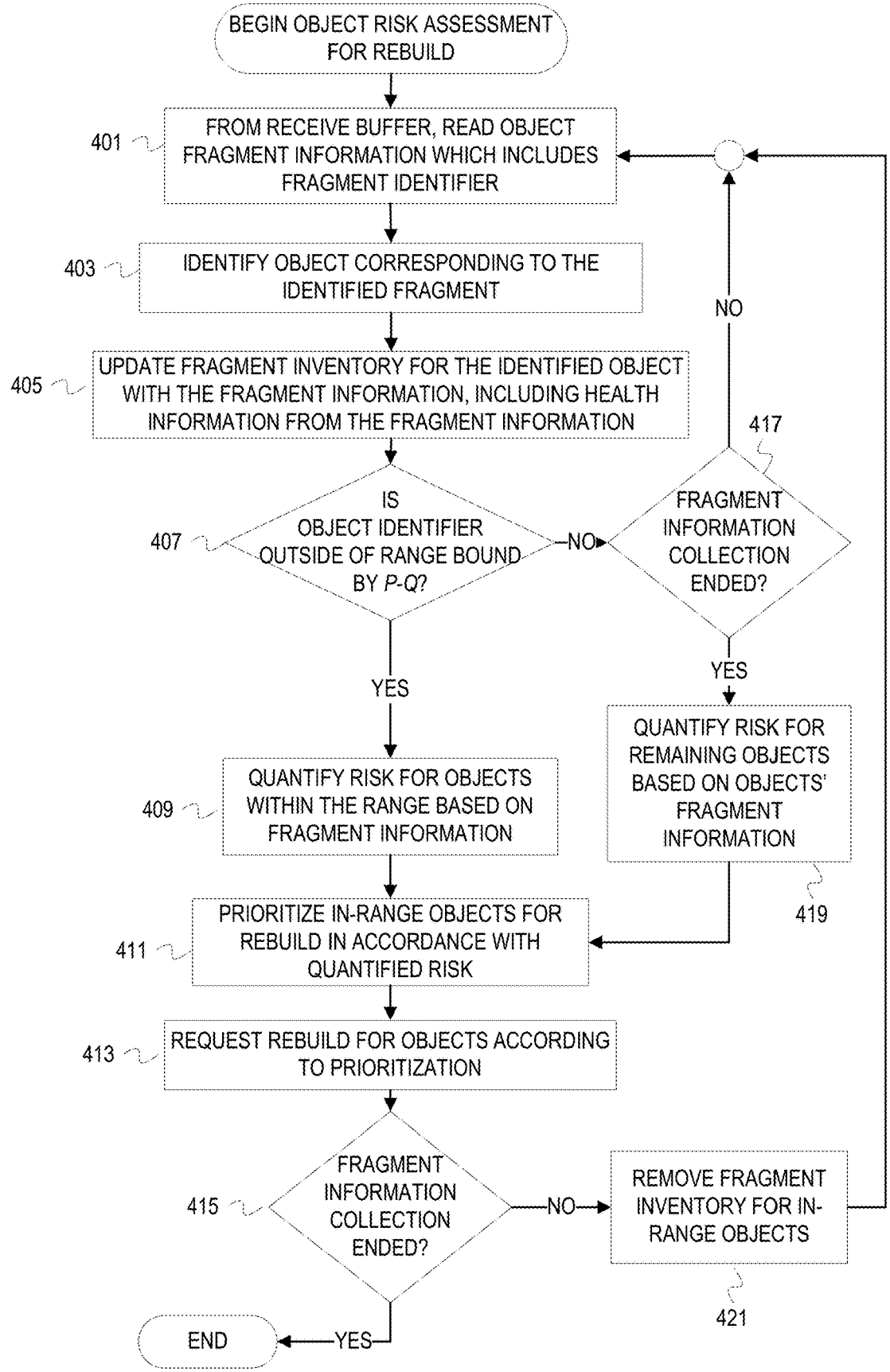
FIG. 4 is a flowchart of example operations for background risk assessment for object rebuild while fragment inventory is conducted.
Figure 5:
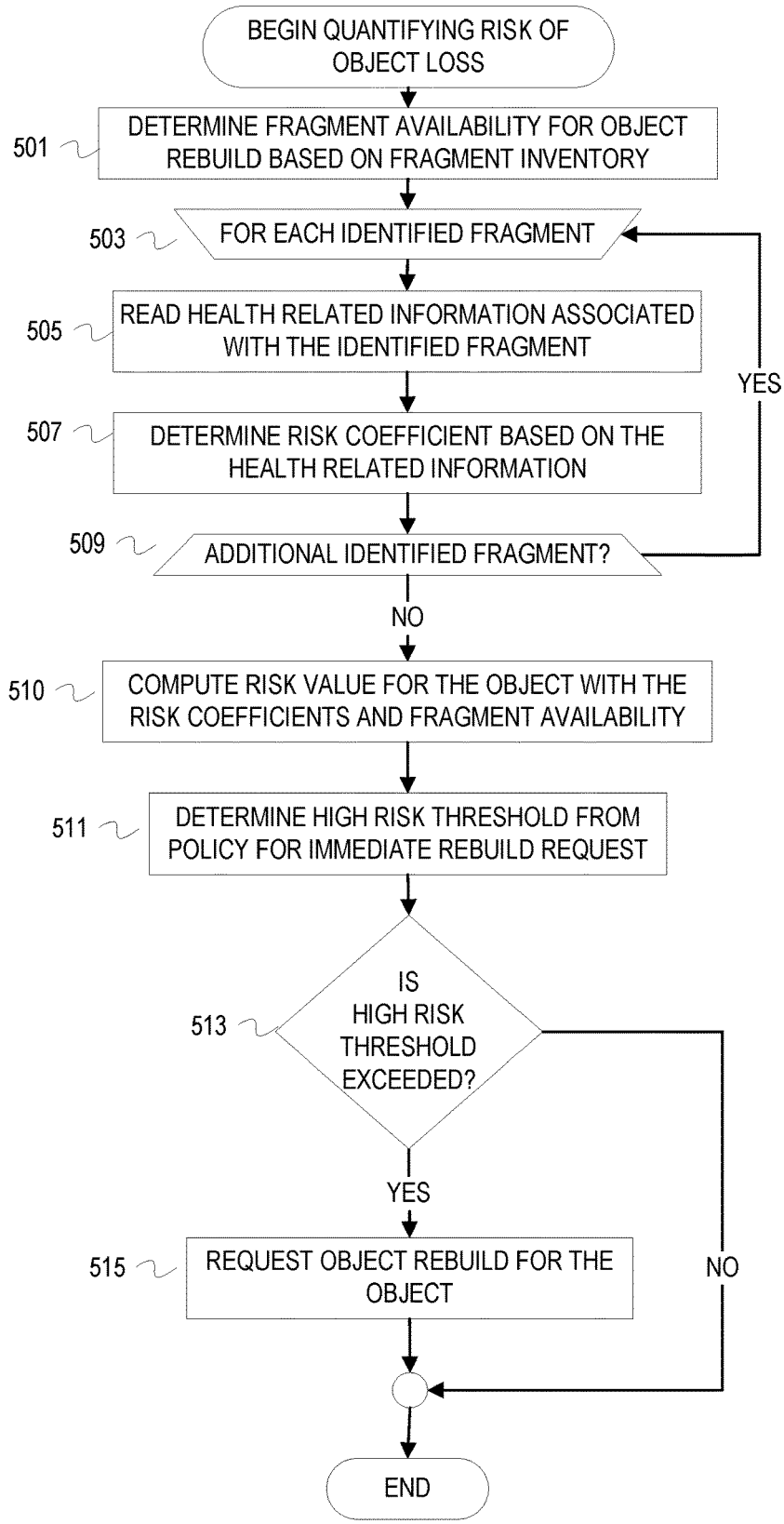
FIG. 5 is a flowchart of example operations for risk quantification with risk coefficients based on health related information.
Figure 6:
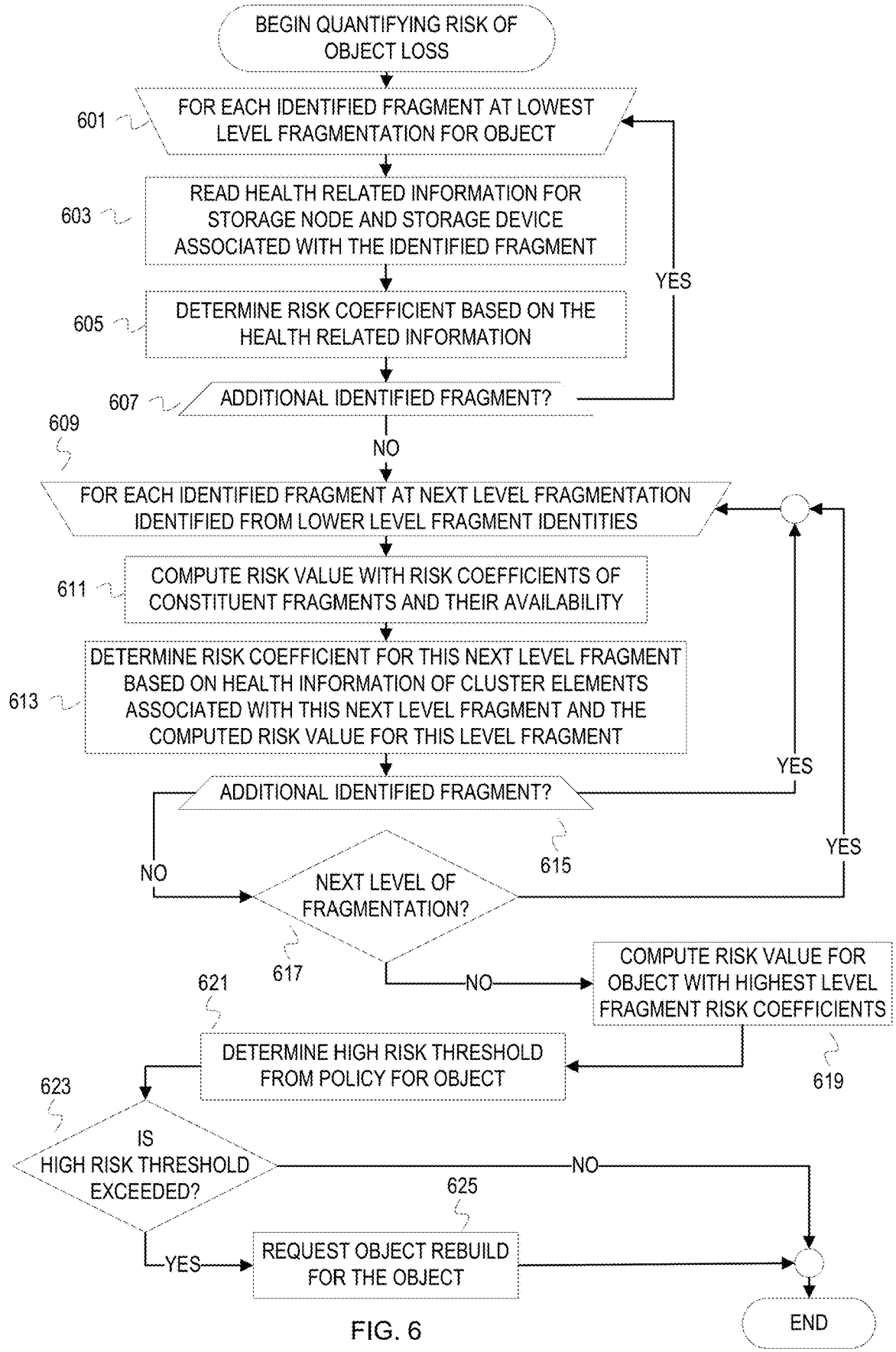
FIG. 6 is a flowchart of example operations for risk quantification with risk coefficients based on health related information across multiple levels of a hierarchical erasure coded storage system.

Although FIG. 1 provides an example context for risk based background object rebuild in an erasure coded storage system, the following flowcharts elaborate on the operations for risk assessment based background rebuild and quantifying risk. FIGS. 3-4 provide flowcharts of example operations for background risk assessment for rebuild of objects. FIGS. 5-6 provide flowcharts of example operations for fragment based risk quantification for object loss. These figures refer to a rebuild node as performing the operations.

FIG. 3 is a flowchart of example operations for background risk assessment for object rebuild after fragment inventory. A rebuild node(s) receives fragment identifiers from reporting storage nodes. The messages or protocol data units carrying these fragment identifiers are buffered in a receive buffer(s) of the storage node. Receive hardware/software associated with the rebuild node and a corresponding communication protocol will provide backpressure to the responding storage nodes by coordinating transmission based on buffer availability.

At block 301, a rebuild node reads a fragment object identifier from a receive buffer. The storage nodes reporting availability of fragments communicate the fragment identifiers according to a communication protocol. The rebuild node will have received buffers defined to receive the fragment object identifiers.

At block 303, the rebuild node identifies an object corresponding to the object fragment identifier. The object fragment identifier can comprise the object identifier or comprise a value that can be used to derive the object identifier. Different techniques can be used to encode or associate the object identifier with the fragment identifier. For example, all fragment identifiers for object FILE1 are identified as FILE1 with a fragment number appended and a decimal point as a delimiter. As another example, the fragment identifier could be a hash of the object identifier concatenated with the fragment number.

At block 305, the rebuild node updates a fragment inventory for the identified object. The rebuild node can maintain fragment inventory per object in a memory that can accommodate the size of the fragment inventory per object. The inventory data can be maintained with a variety of data structures (e.g., a hash table indexed by hashes of object identifiers that reference an array of collected fragment identifiers). If the object identifier is not found in the fragment inventory, then the rebuild node can create a new entry and update that entry to indicate the fragment identifier.

At block 306, the rebuild node determines whether fragment identifier collection has ended. The condition(s) that indicates an end to fragment identifier collection can be administrator driven, can adapt to system status, and/or evolve with size of the storage system. Fragment identifier collection can be allotted an amount of time per object expected to be within the storage system to allow the collection time to adapt to growing (or shrinking) of the storage system in both scale and complexity. Since the fragment identifier collection runs in a background execution space, the fragment identifier collection has a lower priority and can be interrupted/paused depending upon foreground workload and resource availability. The allotted time for fragment identifier collection can be adjusted accordingly. Fragment identifier collection can also be bound by a percentage of objects for which identifiers have been collected. For instance, a particular instance of fragment identifier collection can be considered complete when x % of objects expected to be stored within the storage system are represented in fragment inventory. Missing objects can be tracked through y instances of fragment identifier collection. A rebuild node can prioritize or specify collection of fragment identifiers for those objects not represented in at least one instance of fragment inventory. If fragment identifier collection has not ended, then the rebuild node returns to block 301. Otherwise, the rebuild node continues to block 307.

At block 307, the rebuild node quantifies risk for each object. The rebuild node traverses the fragment inventory and, for each object represented in the fragment inventory, computes a value that represents risk of not being able to rebuild the object from the fragments indicated as available by fragment identifier. This risk value can be a function of the number of available fragments (g) and the minimum number k for the erasure coding. The function can be defined to generate a higher risk value the closer g is to k. The rebuild node can compute and maintain the risk value each time an entry is updated during fragment identifier collection. In this case, the rebuild node would quantify risk during fragment identifier collection and then read the final risk value after collection ends.

At block 309, the rebuild node prioritizes objects for rebuild in accordance with the quantified risk. The rebuild node can determine those objects that have some level of risk and sort those objects according to the degree of risk (i.e., sort based on risk value). Ties can be moderated by object identifiers, policies associated with objects, and/or other information (e.g., a tag that indicates object value to an owner, when the object was last accessed, size of the object, etc.). The rebuild node uses the prioritization as a schedule for requesting rebuild of objects at risk.

At block 311, the rebuild node requests rebuild of objects according to the prioritization. The rebuild node can traverse the rebuild schedule and request rebuild as it encounters each object in the rebuild schedule. The rebuild node can submit the rebuild requests locally or distribute the requests throughout the storage system. For instance, the rebuild node can submit rebuild requests (e.g., a request that includes a GET request with a subsequent PUT request) to a pool of storage nodes designated for rebuild requests. The rebuild node can determine available, idle storage nodes and submit the rebuild requests to those storage nodes. The rebuild node can limit the rebuild requests to itself.

FIG. 4 is a flowchart of example operations for background risk assessment for object rebuild while fragment inventory is conducted. In the example operations of FIG. 4, a rebuild node leverages the ordering of the local fragment store indices. The storage nodes will maintain their fragment store indices ordered by object identifiers or values corresponding to object identifier (e.g., hash values derived from object identifiers). The storage nodes will stream the fragment information to the rebuild node as the local fragment store indices are traversed. This results in the rebuild node receiving streams of fragment information ordered by object identifiers. By leveraging this ordering, the rebuild node can use a smaller, faster memory to maintain fragment inventory by object. The fragment inventory will have a smaller memory footprint because fragment inventory for objects 1-3, for example, will be complete when the rebuild node begins receiving fragment information for objects 4 or greater. In other words, a rebuild node can establish an object identifier range bound by identifiers q and p. Since the streaming information is ordered, the rebuild node can begin risk assessment for the objects within that identifier window when it starts to receive fragment information for objects outside of that object identifier range.

At block 401, a rebuild node reads fragment information from a receive buffer. The fragment information includes a fragment identifier and additional object health related information. Examples of object health related information include health of the reporting storage node (e.g., number of failures or restarts of the storage node over the past month) and health of the storage device on which the corresponding fragment is stored (e.g., seek errors, mean time to failure, date of install, number of bad blocks/sectors, etc.).

At block 403, the rebuild node identifies an object corresponding to the object fragment identifier determined from the fragment information. As previously mentioned, the rebuild node can ascertain the object identifier from the fragment identifier depending upon how the object identifier was associated with or encoded into the fragment identifier.

At block 405, the rebuild node updates a fragment inventory for the identified object with fragment information. The rebuild node updates the fragment inventory for the identified object to indicate the fragment identifier from the fragment information. In addition, the rebuild node adds health related information to the fragment inventory. The rebuild node can maintain a data field(s) associated with each fragment identifier in the fragment inventory of the identified object. This health related information is incorporated into the risk quantification. This allows the risk assessment to take into account the possibility of a currently available fragment becoming unavailable due to poor health of the hosting storage device and/or storage node that manages the hosting storage device.

At block 407, the rebuild node determines whether the identified object is outside of the range bounded by and including object identifiers (or values derived from object identifiers) p and q. As previously mentioned, the ordering of information from the storage nodes allows the rebuild node to presume that fragment information collection has completed for objects within the range p and q when the rebuild node receives fragment information for an object with an identifier that falls outside of the range p and q. If the object identifier is outside of the range, then the rebuild node continues to block 409. If the object identifier is not outside of the range, then the rebuild node continues to block 417.

At block 417, the rebuild node determines whether fragment information collection has ended. As discussed with respect to FIG. 3, the condition(s) that indicates an end to fragment information collection can be administrator driven, can adapt to system status, and/or evolve with size of the storage system. If fragment information collection has not ended, then the rebuild node returns to block 401. Otherwise, the rebuild node continues to block 419.

At block 409, the rebuild node quantifies risk for each object within the range based on the collected fragment information. The rebuild node traverses the fragment inventory and, for each object represented in the fragment inventory, computes a value that represents risk of not being able to rebuild the object from the fragments indicated as available by fragment identifier. Risk quantification can be done in a manner as described with respect to FIG. 3. Additional examples are illustrated in FIGS. 5 and 6.

Similar to block 409, the rebuild node quantifies risk for each object represented in fragment inventory based on the collected fragment information at 419. For block 419, fragment information collection has ended and the rebuild node can proceed with risk quantification and rebuild for those objects in the current fragment inventory.

The rebuild node continues to block 411 from either block 409 or block 419. At block 411, the rebuild node prioritizes objects for rebuild in accordance with the quantified risk. The rebuild node can determine those objects that have some level of risk and sort those objects according to the degree of risk (i.e., sort based on risk value). The determination of the whether the identified object is in the fragment inventory (405 and 305) and the sorting can be performed according to a MapReduce implementation. The rebuild node uses the prioritization as a schedule for requesting rebuild of objects at risk.

At block 413, the rebuild node requests rebuild of objects according to the prioritization. The rebuild node can traverse the rebuild schedule and request rebuild as it encounters each object in the rebuild schedule. The rebuild node can submit the rebuild requests locally or distribute the requests throughout the storage system. For instance, the rebuild node can submit rebuild requests (e.g., a request that includes a GET request with a subsequent PUT request) to a pool of storage nodes designated for rebuild requests. The rebuild node can determine available, idle storage nodes and submit the rebuild requests to those storage nodes. The rebuild node can limit the rebuild requests to itself.

At block 415, the rebuild node determines whether fragment information collection has ended. This is not a determination redundant with block 417, but the same determination in a different execution path. If fragment information collection has not ended, then the rebuild node continues to block 421. If fragment information collection has ended, then the flow ends.

At block 421, the rebuild node removes the fragment inventory for the in-range objects. Since the rebuild node has quantified the risk for the in-range objects and scheduled rebuild accordingly, the rebuild node can clear the objects from memory to allow assessment to continue with the next range of objects. The rebuild node continues to block 401 from block 421.

FIG. 5 is a flowchart of example operations for risk quantification with risk coefficients based on health related information. Although quantifying risk based on fragments available for rebuild of an object allows for proactive rebuild that accounts for approaching the erasure coding k, additional health related information about the devices that store and access data allows for more intelligent risk quantification. Considering the aforementioned decrease in reliability of storage devices, risk quantification that accounts for forecasted device reliability in addition to fragment availability increases durability/protection of the data.

At block 501, the rebuild node determines fragment availability for object rebuild based on fragment inventory for an object. The rebuild node can count the identified fragments to determine whether sufficient fragments are available for rebuild of an object and then compute a preliminary risk value based on the count of available fragments. This value can then be modified according to the health related information that was also collected. The rebuild node could also wait to compute a risk value until determining a risk coefficient for each available fragment. If insufficient fragments are available, the rebuild node can exit the process and log/notify the lack of sufficient fragments for object rebuild.

At block 503, the rebuild node selects a fragment identifier and corresponding health related information to begin operations to compute risk coefficients for each identified fragment.

At block 505, the rebuild node reads the health related information associated with the identified fragment. The health related information can be separated between health information for a storage device and health information for a storage node. The health information can be at other layers of data access also. For instance, health information (e.g., power disruptions) for a rack or data center corresponding to the fragment's host storage device may also be included in the fragment information. In some cases, certain health related information may be reported separately from the fragment information. For instance, health information for a storage node can be reported separately and then applied to fragments associated with the storage node.

At block 507, the rebuild node determines a risk coefficient(s) based on the health related information. The rebuild node can determine a risk coefficient for each distinct value of the health related information. The rebuild node can look up risk coefficients predefined for certain values or ranges of values for various health attributes. For example, the rebuild node can look up a risk coefficient predefined for a storage device with a number of seek errors that falls within a particular range. If multiple risk coefficients are determined, the rebuild node can assign weights to the risk coefficients based on the particular health attribute and/or the data layer. For example, a risk coefficient for a health attribute at the storage device layer may be assigned greater weight than a health attribute at the storage node layer. The rebuild node can compute the risk coefficient as a function of forecasted time to failure based on the health related information and time to a next background rebuild.

At block 509, the rebuild node determines whether there is another identified fragment to process. If so, then the rebuild node selects the next identified fragment at 503. Otherwise, the rebuild node proceeds to block 510.

At block 510, the rebuild node computes a risk value for the object with the determined risk coefficients and fragment availability. The rebuild node can assign each available fragment a weight of 1 to represent availability and modify that 1 by the fragment's risk coefficient. For instance, a risk coefficient for fragment 3 may have been determined to represent likelihood of a storage device failing before the next background rebuild based on statistics collected from a S.M.A.R.T. system of the storage device. This risk coefficient reduces the availability value. The rebuild node can then sum the modified availability values to arrive at a risk value that quantifies the risk of losing the object.

At block 511, the rebuild node determines, from a policy associated with the object, a risk threshold for immediate rebuild request. A policy for a storage system, a customer, a specific object, etc., can define a high risk threshold. If the risk threshold is exceeded by an object's risk value, then the rebuild node requests object rebuild without waiting for prioritization.

At block 513, the rebuild node determines whether the high risk threshold has been exceeded by the computed risk value. If so, then the rebuild node requests object rebuild for the object at block 515. Otherwise, object risk quantification ends.

FIG. 6 is a flowchart of example operations for risk quantification with risk coefficients based on health related information across multiple levels of a hierarchical erasure coded storage system. With hierarchical erasure coding, risk of losing an object depends on availability of fragments at different levels. Using an example of 2-level erasure coding, a fragment at the top level may be at higher risk of not being able to be rebuilt from the lower level fragments than risk of not being able to be able to rebuild the object from the second level fragments. A rebuild node begins risk quantification based on fragment information for the lowest level fragments (i.e., information about the fragments stored on storage devices).

At block 601, the rebuild node selects a fragment identifier for an object at a lowest level of fragmentation to begin operations to compute risk coefficients for each identified fragment.

At block 603, the rebuild node reads the health related information of a storage node and a storage device associated with the identified fragment. The health related information can be separated between health information for the storage device and health information for the storage node. As mentioned earlier, certain health related information may be reported separately from the fragment information. For instance, health information for a storage node can be reported separately and then applied to fragments associated with the storage node.

At block 605, the rebuild node determines a risk coefficient(s) based on the health related information. The rebuild node can determine a risk coefficient for each distinct value of the health related information. The rebuild node can look up risk coefficients predefined for certain values or ranges of values for various health attributes. If multiple risk coefficients are determined, the rebuild node can assign weights to the risk coefficients based on the particular health attribute and/or the data layer. The rebuild node can compute the risk coefficient as a function of forecasted time to failure based on the health related information and time to a next background rebuild.

At block 607, the rebuild node determines whether there is another identified fragment of the lowest fragmentation level to process. If so, then the rebuild node selects the next identified fragment of this lowest level at 601. Otherwise, the rebuild node proceeds to block 609.

At block 609, the rebuild node selects a next level fragment identifier of a fragment that is formed from the lower level fragment already identified.

At block 611, the rebuild node computes a risk value for the next level fragment with the determined risk coefficients of the constituent fragments and availability of the constituent fragments. This is similar to computing the risk value for an object, but uses the risk coefficients and availability of the fragments that constitute currently level fragment being processed.

At block 613, the rebuild node determines a risk coefficient based on the health related information of devices at a corresponding data layer and based on the computed risk value. For instance, the rebuild node determines cluster level health related information, for example health of network elements that connect the various storage nodes, such as number of dropped packets by a router. The rebuild node can look up risk coefficients predefined for this layer or compute the coefficients based on the health values (e.g., compute the risk coefficient as a function of number of dropped packets). The rebuild node can then modify the computed risk value with this determined risk coefficient, transforming the risk value of the current level fragment into a risk coefficient for the current level fragment.

At block 615, the rebuild node determines whether there is another identified fragment of the current fragmentation level to process. If so, then the rebuild node selects the next identified fragment of this level at 609. Otherwise, the rebuild node proceeds to block 617.

At block 617, the rebuild node determines whether there is another higher level of fragmentation. If so, the rebuild selects the next level of fragmentation and proceeds to process the fragments of that next level at 609. Otherwise, the rebuild node proceeds to block 619.

At block 619, the rebuild node computes a risk value for the object with the determined risk coefficients and availability of the highest level fragments that form the object. Computing the risk value for the object is similar to block 510. However, the availability and risk coefficients of the highest level fragments have already incorporated the risk information for lower level fragments.

At block 621, the rebuild node determines, from a policy associated with the object, a high risk threshold for immediate rebuild request. A policy for a storage system, a customer, a specific object, etc., can define a high risk threshold. If the risk threshold is exceeded by an object's risk value, then the rebuild node requests object rebuild without waiting for prioritization.

At block 623, the rebuild node determines whether the high risk threshold has been exceeded by the computed risk value for the object. If so, then the rebuild node requests object rebuild for the object at block 625. Otherwise, object risk quantification ends.

Variations

In some cases, risk assessment can be included in object gathering. As an object gatherer collects fragments to rebuild an object for a retrieval request, the gatherer can perform risk assessment on the object being retrieved. The fragment gatherer can communicate a quantified risk for the object being retrieved to a background process responsible for risk assessment. For example, the fragment gatherer can write the quantified risk along with a time stamp to a memory location assigned to the background process.

The example illustrations perform risk assessment for background rebuild with fragment identifiers. This allows the rebuild process to more efficiently rebuild an object because the rebuild process will refrain from requesting fragments that were not in the fragment inventory taken for risk assessment. Taking fragment inventory by fragment identifier also ensures reported fragments are unique for an object. However, other mechanisms can be relied upon to ensure fragment uniqueness and allow for less overhead in risk assessment for background rebuild. Reporting nodes can report an object identifier and a count of available fragments for the identified object. A rebuild node will read the reported information, which includes an object identifier and a fragment count, and then sum the counts across reporting nodes to determine a total number of fragments available for an object. If the storage system does not have copies of objects, then repeat counting of an object fragment will not be a concern. In case of a storage system with redundant copies of an object (e.g., backup copies, mirroring, etc.), various other mechanisms can be relied upon by the rebuild process. The storage system may enforce unique object identifiers across copies (i.e., namespace constraints for objects). Thus, fragment count by object identifier will not repeat count a same fragment from different storage nodes. The topology system may designate tiers of storage nodes to differentiate nodes that maintain copies of objects (e.g., primary storage node and backup storage node). Reporting of fragment inventory count can be limited to one of the storage node tiers per object to avoid repeat counting of a fragment. The limitation may be explicit (i.e., explicit selection of the primary node from topology information in a pull scenario) or may be a function of the system (e.g., a primary node reports unless it is unavailable when fragment inventory is taken).

Regardless of the specific implementation for fragment count based inventory, a storage node may be unavailable for fragment inventory (e.g., node failure, network failure, etc.). A rebuild node determines a set of storage nodes that should report from the topology service. If a storage node expected to report does not report, for example within a predefined time window, then the rebuild node considers all fragments at that storage node unavailable. This determination of fragment absence based on lack of reported fragment inventory is efficient since the rebuild node will have a total available fragment count that does not include any fragments maintained by the non-reporting node. The rebuild node does not need actual knowledge of the fragments at the non-reporting storage node.

The above example illustrations primarily describe risk assessment and rebuild being performed in the background (e.g., having lower priority than foreground processes/tasks). However, embodiments can perform risk assessment, including fragment inventory, and rebuild in the foreground execution space. For example, an administrator command can explicitly invoke risk assessment and rebuild to be done as foreground tasks. Risk assessment and/or rebuild can also be performed in the foreground execution space under certain conditions. For example, risk assessment and rebuild can be executed as foreground tasks if risk assessment and rebuild has been skipped or delayed for a specified period of time or a number of attempts. Another example condition could be a threshold number of failures within the storage system. In addition, rebuild can be performed in the background execution space. Whether risk assessment is performed in foreground or background execution space, rebuild for a single data object or multiple objects may be lower priority that other tasks currently being performed in the foreground execution space. For those cases or as a default, rebuild can performed in the background execution space.

The examples refer to "nodes," both rebuild nodes and storage nodes. The node is a construct used to refer to implementation of functionality for background rebuild based on object loss risk assessment. This construct is utilized since numerous implementations are possible. A node may be a particular component or components of a machine (e.g., a particular circuit card enclosed in a housing with other circuit cards/boards), machine-executable program or programs, a circuit card with circuitry configured and programmed for background rebuild based on object loss risk assessment, etc. The term is used to efficiently explain content of the disclosure. Although the examples refer to operations being performed by a rebuild node, different entities can perform different operations. For instance, a dedicated co-processor or application specific integrated circuit can quantify risk while another processor/core/process collects fragment information.

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operation(s) represented by block 411 may not be performed. A rebuild node may not prioritize rebuild of objects within a range and concurrently request rebuild for all of the at risk objects within the object range. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

A machine readable signal medium may include a propagated data signal with machine readable program code embodied therein, for example, in baseband or as fragment of a carrier wave. Such a propagated signal may take any of a variety of forms, including, but not limited to, electro-magnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

Figure 7:
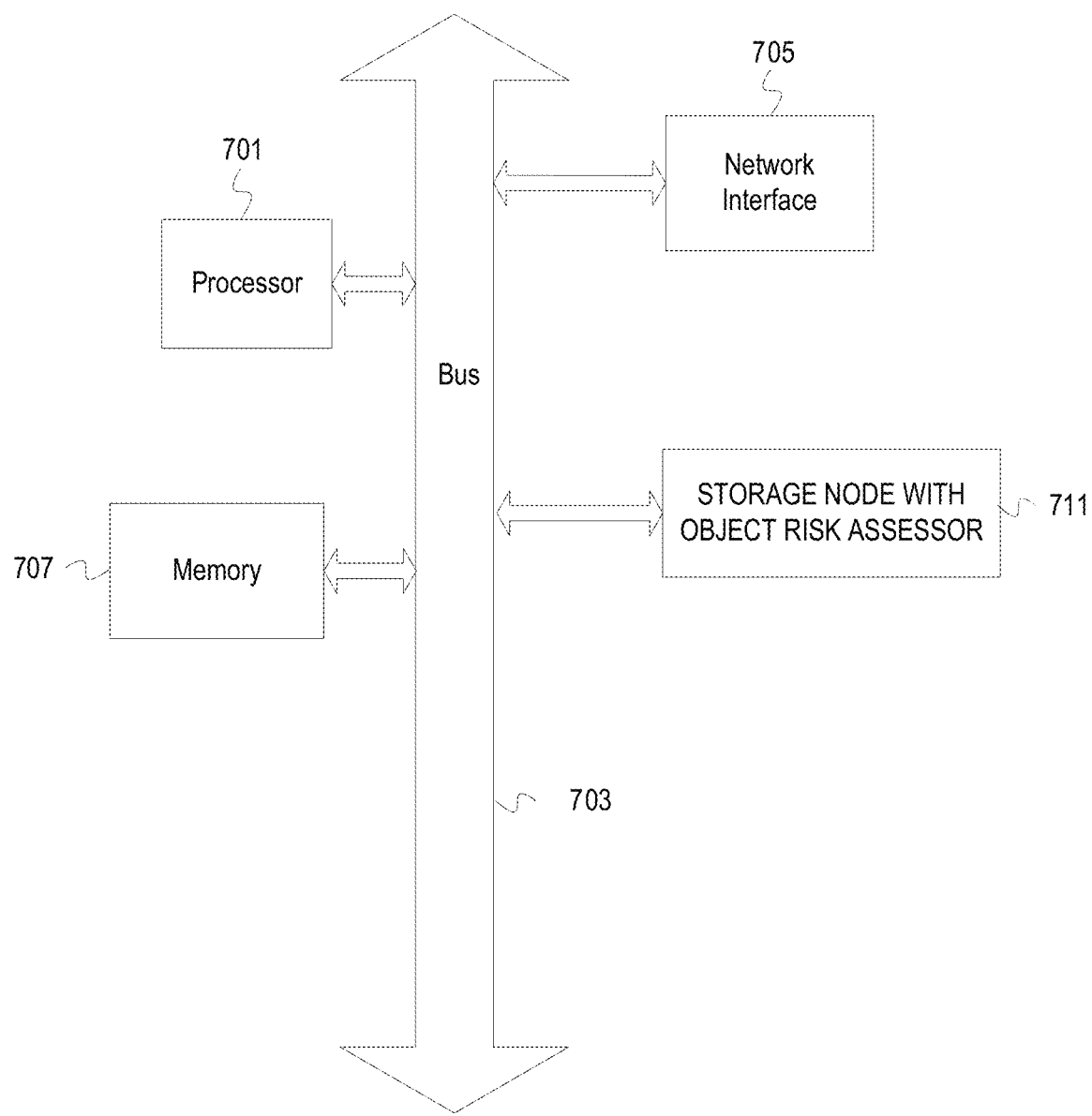
FIG. 7 depicts an example computer system with a storage node with an object risk assessor.

FIG. 7 depicts an example computer system with a storage node with an object risk assessor. The computer system includes a processor 701 (possibly including multiple processors, multiple cores, multiple nodes, and/or implementing multi-threading, etc.). The computer system includes memory 707. The memory 707 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 703 (e.g., PCI, ISA, PCI-Express, HyperTransport® bus, InfiniBand® bus, NuBus, etc.) and a network interface 705 (e.g., a Fiber Channel interface, an Ethernet interface, an internet small computer system interface, SONET interface, wireless interface, etc.). The system communicates via transmissions to and/or from remote devices via the network interface 705 in accordance with a network protocol corresponding to the type of network interface, whether wired or wireless and depending upon the carrying medium. In addition, a communication or transmission can involve other layers of a communication protocol and or communication protocol suites (e.g., transmission control protocol, Internet Protocol, user datagram protocol, virtual private network protocols, etc.).The system also includes a storage node 711. The storage node 711 assesses risk of losing a data object based, at least, on constituent fragment availability and requests rebuild of at risk objects. Any one of the previously described functionalities may be partially (or entirely) implemented in hardware and/or on the processor 701. For example, the functionality may be implemented with an application specific integrated circuit, in logic implemented in the processor 701, in a co-processor on a peripheral device or card, etc. Further, realizations may include fewer or additional components not illustrated in FIG. 7 (e.g., video cards, audio cards, additional network interfaces, peripheral devices, etc.). The processor 701 and the network interface 705 are coupled to the bus 703. Although illustrated as being coupled to the bus 703, the memory 707 may be coupled to the processor 701.

While the aspects of the disclosure are described with reference to various implementations and exploitations, it will be understood that these aspects are illustrative and that the scope of the claims is not limited to them. In general, techniques for background risk assessment to drive object rebuild as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

What is claimed is:

1. A computer implemented method comprising:
    transmitting requests to a plurality of storage nodes of a storage system to obtain from the storage nodes indications of availability of constituent fragments of a first data object, wherein the first data object is divided into the constituent fragments stored in the storage system according to an erasure coding technique;
    quantifying a first risk of losing capability to rebuild the first data object based on the indications of the availability of the constituent fragments of the first data object for rebuilding the first data object according to the erasure coding technique; and
    in response to the quantified first risk exceeding a first threshold, prioritizing rebuild of the first data object by the storage system according to the quantified first risk.

2. The method of claim 1, wherein the quantified first risk is determined from a set of discrete degrees of risk.

3. The method of claim 1, wherein quantifying the first risk of losing capability to rebuild the first data object further comprises:
    determining a count of the indications of availability of constituent fragments for the first data object; and
    computing a risk value as a function of the count of the indications of availability of constituent fragments and a minimum number of constituent fragments to rebuild the first data object according to the erasure coding technique.

4. The method of claim 1, wherein quantifying the first risk of losing capability to rebuild the first data object is further based on fragment health related information for a storage device of the storage system on which one or more of the constituent fragments are stored.

5. The method of claim 1, wherein quantifying the first risk of losing capability to rebuild the first data object is further based on computed risk coefficients for the constituent fragments of the first data object based on fragment health related information for a storage device of the storage system on which one or more of the constituent fragments are stored.

6. The method of claim 1, wherein quantifying the first risk of losing capability to rebuild the first data object is further based on heath related information for network elements of the storage system pertaining to the first data object.

7. The method of claim 1 further comprising quantifying a second risk for a second data object in response to a determination that the quantified first risk for the first data object exceeds a second threshold.

8. The method of claim 1 further comprising obtaining constituent fragments corresponding to a second data object while quantifying the first risk of losing capability to rebuild the first data object.

9. The method of claim 1, wherein the obtained indications of the availability of constituent fragments comprise object identifiers and a count of the availability of constituent fragments at corresponding storage nodes.

10. The method of claim 1 wherein the obtaining the availability of the constituent fragments and the quantifying of the first risk of losing capability to rebuild the first data object occur within a set of storage nodes assigned to a region of a namespace encompassing the first data object.

11. The method of claim 1, wherein requesting the rebuild of the first data object comprises submitting a request to retrieve the first data object.

12. The computer implemented method of claim 1 further comprising:
    re-quantifying the first risk when a constituent fragment of the first data object is updated.

13. One or more non-transitory machine-readable media including program code for data object rebuild according to an erasure code of a storage system, the program code configured to:
    in response to receipt of indications of availability of data object fragments for data object rebuild from a plurality of storage nodes of the storage system, quantify risks of losing a capability to rebuild each of one or more of data objects corresponding to the data object fragments based on a count of data object fragments indicated as available for rebuild of a corresponding data object relative to a minimum number of data object fragments according to the erasure code;
    prioritize rebuild of the data objects based on the quantified risks of the data objects; and
    initiate rebuild, within a background execution space, of the data objects according to the prioritization.

14. The one or more non-transitory machine-readable media of claim 13 further comprising program code configured to periodically obtain the indications of availability of data object fragments from the plurality of storage nodes.

15. The one or more non-transitory machine-readable media of claim 13, wherein the program code configured to quantify risks based on a count of data object fragments is further based on health related information of the data object fragments received from the plurality of storage nodes.

16. The one or more non-transitory machine-readable media of claim 13, wherein the program code configured to quantify risks is further configured to re-quantify the quantified risks of the data objects when one or more data object fragments of the data objects is updated.

17. An apparatus comprising:
    a hardware processor; and
    a machine-readable medium including program code executable by the processor to cause the apparatus to,
        obtain, from a plurality of storage nodes of a storage system, indications of availability of constituent fragments for data objects, wherein each of the data objects is divided into constituent fragments stored in the storage system according to an erasure coding technique;
        for each of the data objects, quantify risk of losing capability to rebuild the respective data object based on the indications of availability of the constituent fragments for the respective data object;

compute a risk value as a function of a count of available constituent fragments and a minimum number of constituent fragments to rebuild each data object according to the erasure coding technique; and request rebuild of those of the data objects with a corresponding risk value that exceeds a threshold such that the rebuild of the data objects is prioritized according to the corresponding risk.

18. The apparatus of claim 17, wherein the quantified risk of losing capability is determined from a set of discrete degrees of risk.

19. The apparatus of claim 17, wherein the machine-readable medium including program code configured to quantify risk of losing capability to rebuild the respective data object based on the indications of availability of the constituent fragments is further based on fragment health related information obtained from at least one storage device storing the constituent fragments.

20. The apparatus of claim 17 wherein the program code executable by the process to cause the apparatus to compute the risk value further comprises re-compute the risk value for each data object when a constituent fragment of a respective data object is updated.

* * * * *